United States Patent [19]

Akiyama et al.

[11] Patent Number: 4,593,332

[45] Date of Patent: Jun. 3, 1986

[54] MAGNETIC REPRODUCTION SYSTEM UTILIZING MAGNETIC BODY AS CAPACITOR

[75] Inventors: Junichi Akiyama; Shu Chiba; Norikazu Sawazaki, all of Yokohama, Japan

[73] Assignee: Tokyo Shibaura Denki Kabushiki Kaisha, Kawasaki, Japan

[21] Appl. No.: 485,060

[22] Filed: Apr. 14, 1983

[30] Foreign Application Priority Data

Apr. 21, 1982 [JP] Japan ................... 57-65448

[51] Int. Cl.$^4$ ............ G11B 5/34; G11B 5/04
[52] U.S. Cl. ............... 360/111; 360/30; 360/110
[58] Field of Search ............ 360/110–111, 360/29–30, 113; 365/7

[56] References Cited

U.S. PATENT DOCUMENTS 2,918,534 12/1959 Wiegand .
3,842,407 10/1974 Argyle et al. .
4,120,011 10/1978 Kolb .
4,182,987 1/1980 Moeller .
4,280,158 7/1981 De Niet ........................ 360/113
4,286,216 8/1981 Auld et al. .
4,464,691 8/1984 Sawazaki et al. ............ 360/111

FOREIGN PATENT DOCUMENTS 57-36407 2/1982 Japan .

Primary Examiner—Stuart N. Hecker
Assistant Examiner—David J. Severin
Attorney, Agent, or Firm—Oblon, Fisher, Spivak, McClelland & Maier

[57] ABSTRACT

A capacitance element includes as an interelectrode substance a magnetic body for detecting a magnetic field formed by a magnetic recording medium. A tuned circuit includes the capacitance element as a tuning element and receives a signal from a high-frequency oscillator. The magnetic characteristics of the magnetic body change with changes in the magnetic field formed by the magnetic recording medium. The high-frequency signal output from the tuned circuit changes with changes in the magnetic characteristics of the magnetic body. A detecting circuit detects the changes in the high-frequency signal output so as to reproduce signals recorded on the magnetic recording medium.

11 Claims, 14 Drawing Figures

MAGNETIC REPRODUCTION SYSTEM UTILIZING MAGNETIC BODY AS CAPACITOR

BACKGROUND OF THE INVENTION

The present invention relates to a magnetic reproduction system for performing magnetic reproduction utilizing changes in magnetic characteristics of a magnetic body which result from changes in a magnetic field formed by a magnetic recording medium.

A ring-type magnetic head is conventionally used for reproducing signals recorded on a magnetic recording medium. The magnetic head reproduces the electromotive force induced by a magnetic field formed by the magnetic recording medium. However, with this method, the reproduction output level and the S/N (signal-to-noise ratio) are largely dependent on the track width. Thus, this method is not suitable for high-density recording/reproduction. With a currently available ring-type magnetic head, the track width and the S/N are limited to 20μ and 43 dB, respectively.

In order to solve this problem, the present inventors have previously proposed (in Japanese Patent Disclosure (KOKAI) No. 57-36407) a magnetic reproduction system utilizing a new principle. This system incorporates a magnetic body which detects changes in a magnetic field formed by a magnetic recording medium as changes in the magnetic characteristics of a magnetic body, such as changes in magnetic permeability or high-frequency loss. According to this system, reproduction of signals is performed utilizing changes in the inductance of a coil wound around the magnetic body. The coil constitutes a tuned circuit together with a capacitance element. A high-frequency signal from a high-frequency oscillator is supplied to the tuned circuit. In this case, the magnetic characteristics change in accordance with a magnetic field formed by the magnetic recording medium. When the inductance of the coil wound around the magnetic body changes, the tuning frequency and the quality factor Q (resonance sharpness) of the tuned circuit change. Then, the high-frequency output signal from the tuned circuit changes. Such a change in the high-frequency output signal is detected by a detector, and a reproduction output corresponding to the signal recorded on the magnetic recording medium is obtained.

The above system can detect the slightest change in the magnetic field formed by the magnetic recording medium as a change in the characteristics of the magnetic body. Furthermore, since the reproduction output energy is supplied from a high-frequency oscillator, high-level reproduction may be performed with a high S/N. Satisfactory reproduction may be performed even if the track width is narrowed to 20μ or less.

Thus, the magnetic reproduction system described in Japanese Patent Disclosure (KOKAI) No. 57-36407 is suitable for high-density recording/reproduction, particularly as compared with other conventional systems. However, the recording density is still limited. In order to increase the recording density, the track width may be narrowed and the recording wavelength may be shortened. However, the width of the magnetic body must be decreased with such a decrease in the track width, and also the thickness of the magnetic body must be decreased with such a reduction in the recording wavelength. The thickness of the magnetic body must be decreased since the magnetic field formed by the magnetic recording medium strengthens toward the surface thereof and increasingly so with a decrease in the recording wavelength, that is, with an increase in the recording signal frequency. On the other hand, when the thickness of the magnetic body is increased, the magnetic field can only act on a smaller portion of the magnetic body, resulting in smaller changes in the magnetic characteristics of the magnetic body for the same degree of change in the magnetic field.

In this manner, the dimensions of the magnetic body must be reduced to the smallest possible in order to perform high-density recording/reproduction. Then, the dimensions of the coil to be wound around the magnetic body must also be reduced. When the dimensions of the coil are reduced, the quality factor Q is lowered due to an increase in the DC resistance. Since the Q of the tuned circuit is restricted by the Q of this coil, characteristic changes in the magnetic body due to the magnetic field formed by the magnetic recording medium may not be effectively converted into electrical signals. When the dimensions of the magnetic body are made very small, the ratio of the volume of the magnetic body to the effective volume of the coil, that is, the filling factor, is lowered, thereby degrading reproduction sensitivity. When the dimensions of the magnetic body are on the order of millimeters, the coil may be wound tightly around the magnetic body and the filling factor may be made approximately equal to 1. However, when the thickness of the magnetic body is significantly reduced to the order of microns, the filling factor in the direction of the thickness becomes ½ if the thickness of the coil wound on the magnetic body is also on the order of microns. When the thickness of the magnetic body is even further reduced to the order of submicrons, a decrease in the filling factor and reproduction sensitivity becomes even more pronounced.

SUMMARY OF THE INVENTION

It is an object of the present invention to provide a magnetic reproducer system which allows signal reproduction at a satisfactorily high level and a high S/N even if the track width is very small.

In order to achieve the above object, the system of the present invention has a capacitance element which includes as an interelectrode substance a magnetic body which detects a magnetic field formed by a magnetic recording medium. A tuned circuit includes such a capacitance element as a tuning element and receives a high-frequency signal. The magnetic characteristics of the magnetic body change with changes in the magnetic field formed by the magnetic recording medium. A high-frequency signal output from the tuned circuit changes with changes in the magnetic characteristics of the magnetic body. The signals recorded on the magnetic recording medium are reproduced by detecting this high-frequency signal output from the tuned circuit.

In general, when an AC voltage is applied to the capacitance element, a conduction current and a displacement current flow through the interelectrode substance. The magnitudes of these currents vary in accordance with the physical properties of the interelectrode substance. However, the sum of the magnitudes of these two currents is approximately equal to the conduction current which flows through the conductive wires at the two ends of the capacitance element. The two currents can generate a magnetic field in the capacitance element. If the conductivity of the interelectrode substance is very small, only the displacement current flows in the capacitance element. The displacement current then generates an AC magnetic field in the interelectrode substance.

A capacitance element of the present invention uses as an interelectrode substance a magnetic body which has a low conduction loss and high magnetic permeability and high-frequency loss when subjected to a magnetic field. When an external magnetic field is applied to the capacitance element through which a high-frequency current flows, the magnetic permeability and high-frequency loss of the magnetic body change. This may be taken to mean that the apparent capacitance and high-frequency loss of the capacitance element are modulated in accordance with changes in the external magnetic field intensity. Therefore, if a tuned circuit has such a capacitance element as a tuning element, a high-frequency signal output from the tuned circuit is subject to changes in accordance with changes in an external magnetic field intensity, i.e., in the strength of the magnetic field formed by the magnetic recording medium.

With the system of the above configuration, the Q of the tuned circuit will not be inadvertently decreased even if the dimensions of the magnetic body are decreased for ultra high-density recording/reproduction. The problem of reduction in the filling factor which was encountered with the system disclosed in Japanese Patent Disclosure (KOKAI) No. 57-36407 may be eliminated. Accordingly, the reproduction sensitivity will not be degraded and a satisfactorily high signal reproduction level and S/N can be obtained even in the case of ultra high-density recording/reproduction involving a track width of 20 μm or less.

BRIEF DESCRIPTION OF THE DRAWINGS

Other objects and advantages will be apparent from the following description taken in conjunction with the accompanying drawings, in which.

DETAILED DESCRIPTION OF THE PREFERRED EMBODIMENTS

Figure 1:
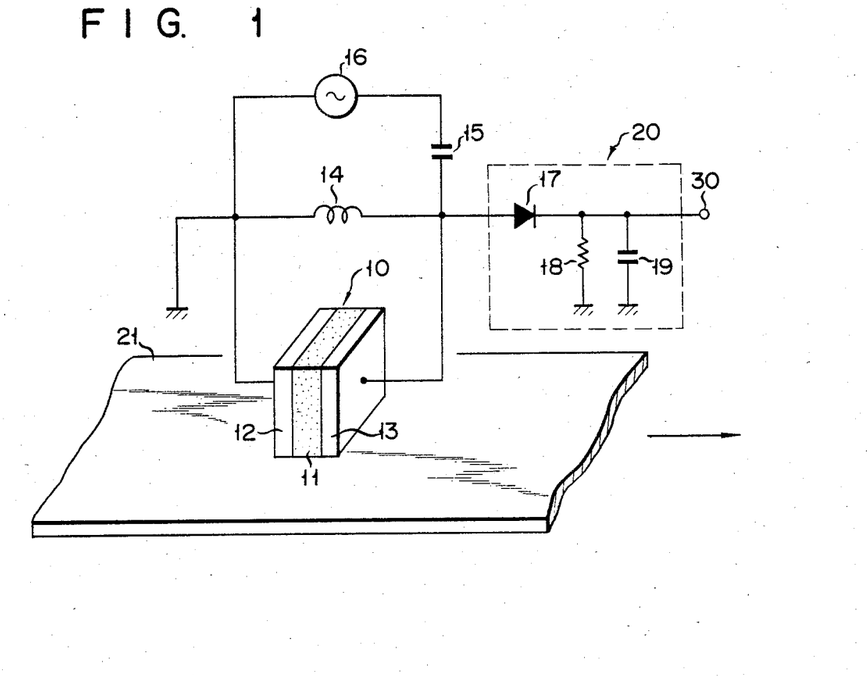
FIG. 1 is a schematic representation showing a magnetic reproducer system according to an embodiment of the present invention.

The preferred embodiment of the present invention will be described with reference to FIG. 1. Referring to FIG. 1, a capacitance element 10 comprises plate-shaped metal electrodes 12 and 13, and a magnetic body 11 interposed therebetween. The capacitance element 10 constitutes, together with an inductance element 14, an LC parallel tuned circuit and serves as a magnetic head. One end of the tuned circuit is connected to a high-frequency oscillator 16 through a capacitor 15, while the other end thereof is grounded. The capacitor 15 is for DC cutoff and for making the high-frequency oscillator 16 equivalent to a current source. The capacitance of the capacitor 15 is set to be small such that it may not adversely affect the operation of the tuned circuit. The one end of the tuned circuit is further connected to a peak detector 20 consisting of a diode 17, a resistor 18 and a capacitor 19. One end of the capacitor 15 is connected to the anode of the diode 17. The cathode of the diode 17 is grounded through a parallel circuit of a resistor 18 and a capacitor 19 and is also connected to the input end of a power amplifier (not shown) through an output terminal 30.

Figure 2:
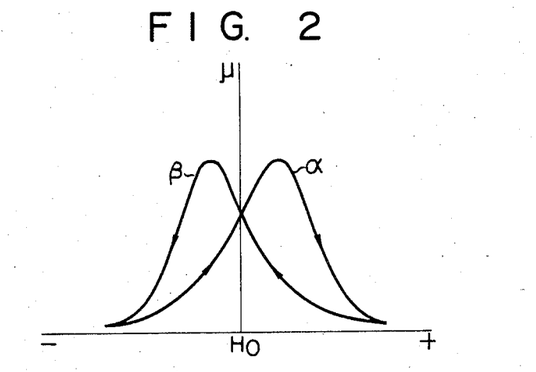
FIG. 2 is a graph showing changes in magnetic permeability $\mu$ as a function of changes in a magnetic field intensity.
Figure 3A:
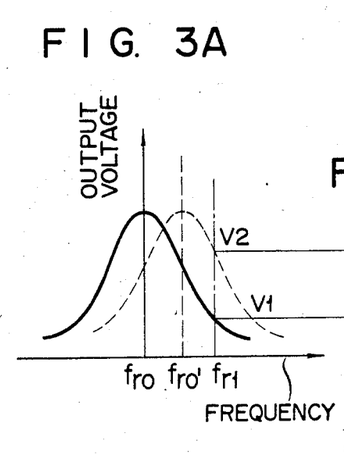
FIG. 3A is a graph showing changes in the output voltage of a tuned circuit with changes in tuning frequency.
Figure 3B:
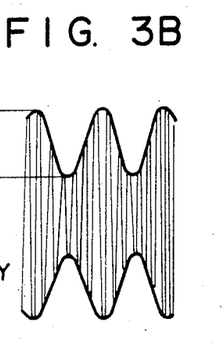
FIG. 3B shows the waveform of an output signal from an oscillator which is amplitude-modulated in accordance with the changes in the tuning frequency due to changes in the recording magnetic field intensity.
Figure 3C:
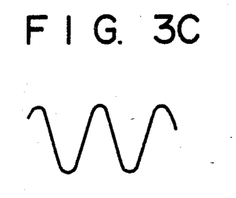
FIG. 3C shows the waveform for explaining the peak detection of a high-frequency signal shown in FIG. 3B.

In a magnetic reproducer system of the configuration described above, when a magnetic tape 21 with signals recorded thereon is driven in contact with the capacitance element 10, a magnetic field intensity varying with the recorded signals is applied to the capacitance element 10. Then, the magnetic permeability $\mu$ of the magnetic body 11 changes as shown in FIG. 2. When the magnetic body 11 is magnetized in one direction by the magnetic field formed by the recorded magnetic tape 21, the magnetic permeability $\mu$ changes as indicated by curve $\alpha$ in the direction indicated by arrows. When the magnetic body 11 is, however, magnetized in the opposite direction, the magnetic permeability $\mu$ changes as indicated by curve $\beta$ in the direction also indicated by arrows. The material of the magnetic body 11 is selected from among substances which experience large changes in magnetic permeability $\mu$ and extremely small changes in conductivity, such as spinel- or garnet-type ferrite which are suitable for formation into thin films. When the tuned circuit is operated in a frequency range in which high-frequency loss may not occur, the apparent capacitance of the capacitance element 10 incorporating the magnetic body 11 changes greatly with changes in the magnetic permeability $\mu$ of the magnetic body 11. Then, the tuning frequency of the tuned circuit consisting of the capacitance element 10 and the inductance element 14 changes. For example, if the initial tuning frequency of the tuned circuit is set to be fr0, as shown in a characteristic curve indicated by the solid line in FIG. 3A, the tuning frequency changes to f'r0, as shown in a characteristic curve indicated by the dotted line in FIG. 3A, with changes in the capacitance of the capacitance element 10. Therefore, if the frequency of a high-frequency signal to be supplied to the tuned circuit from the high-frequency oscillator 16 is set to be fr1 in FIG. 3A, the voltage across the tuned circuit changes from V1 to V2. Then, the output from the high-frequency oscillator 16 is amplitude-modulated at the tuned circuit by the signals recorded on the magnetic tape 21 as shown in FIG. 3B. The modulated signal from the oscillator is supplied to a detector, for example, the peak detector 20, for peak detection. As a result, the detection output, i.e., the signal reproduction output, as shown in FIG. 3C is obtained.

Figures 4A, 4B:
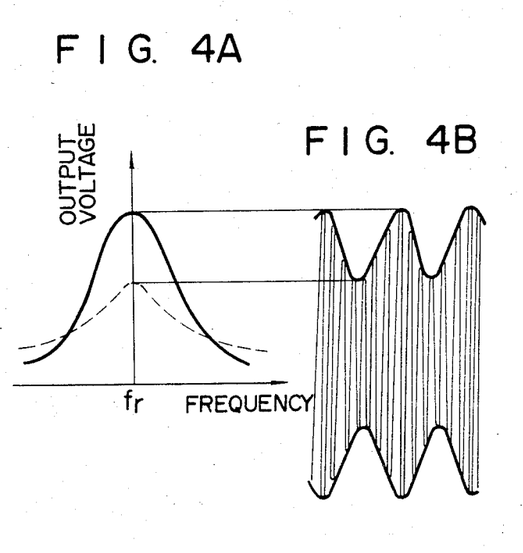
FIG. 4A is a graph showing changes in the output voltage of a tuned circuit with changes in a Q of the tuned circuit.
FIG. 4B shows the waveform of an output signal from an oscillator which is amplitude-modulated in accordance with the changes in the Q of the tuned circuit due to changes in the recording magnetic field intensity.
Figure 4C:
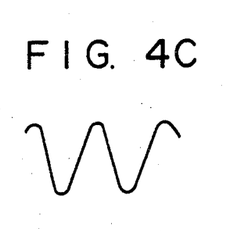
FIG. 4C shows the waveform for explaining the peak detection of the high-frequency signal shown in FIG. 4B.

In the description of the above embodiment, signals are reproduced utilizing changes in the tuning frequency corresponding to changes in the capacitance of the capacitance element 10 which are caused by changes in the magnetic permeability of the magnetic body 11. However, with a system of a similar configuration, signal reproduction may also be performed by utilizing changes in the Q of the tuned circuit which correspond to changes in the high-frequency loss of the magnetic body 11. More specifically, high-frequency loss of the magnetic body 11 changes with magnetization conditions thereof, and the Q of the tuned circuit also changes accordingly. Accordingly, a large change in the Q may be obtained if the magnetic body 11 of a material which experiences large changes in high-frequency loss with changes in the magnetic field, that is, a spinel- or garnet-type ferrite, is used at frequency fr substantially equal to the tuning frequency of the tuned circuit. When the Q changes, the voltage across the tuned circuit changes as shown in FIG. 4A. Since the output from the high-frequency oscillator 16 is amplitude-modulated by changes in the Q as shown in FIG. 4B, peak detection of the output from the oscillator 16 will provide a reproduction output as shown in FIG. 4C.

Figure 5:
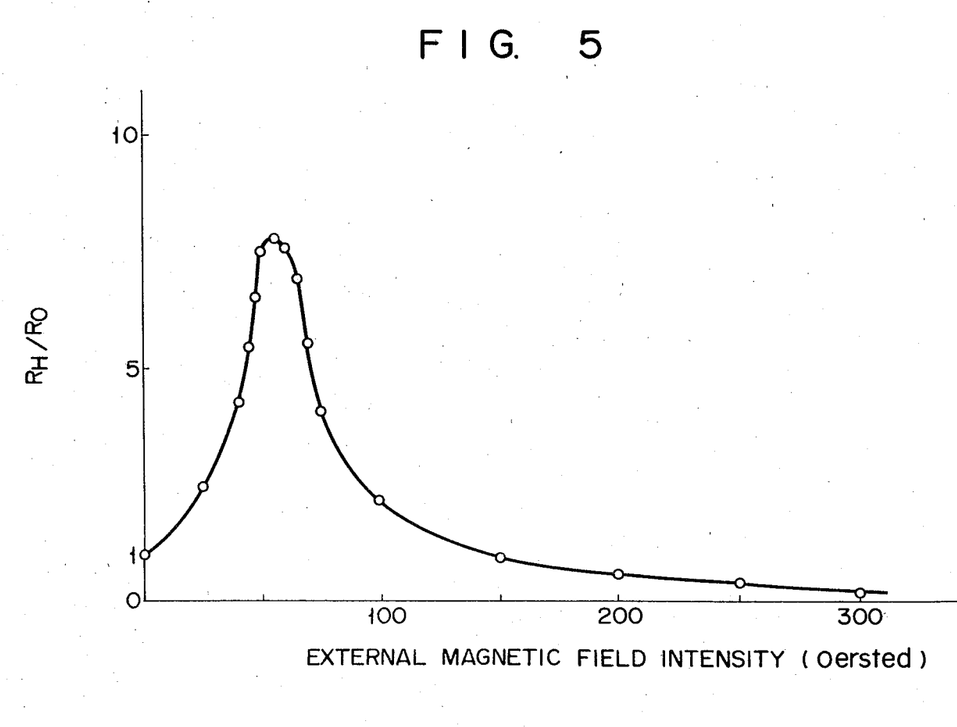
FIG. 5 is a graph showing a ratio RH/RO as a function of an external magnetic field intensity, wherein RH is the real part of an impedance obtained upon application of an external magnetic field, and RO is the real part of an impedance obtained when no external magnetic field is applied, when a high-frequency voltage is applied to a capacitance element including a magnetic body as an interelectrode substance.

FIG. 5 shows the ratio RH/RO as a function of external magnetic field intensity where RH and RO are the real parts of the impedance of the capacitance element 10 when a high-frequency voltage of 500 MHz is applied to the capacitance element, with and without application of an external magnetic field, respectively. The capacitance element 10 used for these measurements included electrodes 12 and 13 and the magnetic body 11 sandwiched therebetween. The real part RH corresponds to high-frequency loss. The magnetic body 11 used was a sample disc of 10 mm$\phi$ and 1 mmt and consisted of Al-substituted yttrium-iron garnet ferrite with low conduction loss (saturation magnetization $4\pi MS=370$ gausses). The external magnetic field was applied to the capacitance element 10 along the radial direction of the disc. According to the measurements made, when the external magnetic field intensity was increased to about 60 Oe, the ratio RH/RO increased significantly to 7.5 times that with a zero external magnetic field intensity. Since the changes in DC resistance due to changes in external magnetic field intensity and the conduction current are negligible, and the conduction loss is small. Therefore, the ratio RH/RO is regarded as the apparent resistance change of the impedance corresponding to high-frequency loss caused by mutual interaction of the magnetic body 11 and the high-frequency magnetic field formed by the displacement current flowing between the electrodes 12 and 13.

Figure 6:
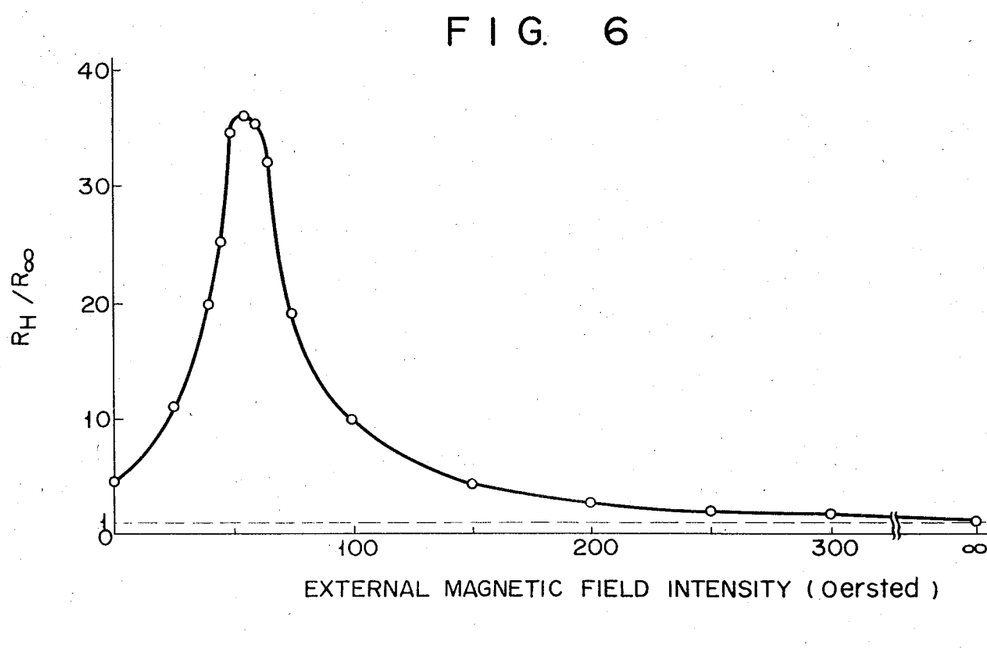
FIG. 6 is a graph showing a ratio $RH/R\infty$ as a function of an external magnetic field intensity, wherein RH is the real part of an impedance of a capacitance element upon application of an external magnetic field, and $R\infty$ is the real part of an impedance of the capacitance element upon application of an external magnetic field which is intense enough to cause no further changes in impedance.

FIG. 6 shows the same results from a different aspect. That is, the graph in FIG. 6 shows the ratio $RH/R\infty$ as a function of an external magnetic field intensity where RH is the real part of the impedance of the capacitance element with application of an external magnetic field and $R\infty$ is the real part of the impedance of the capacitance element upon application of an external magnetic field, for example, more than 500 oersteds, which is intense enough to cause no further changes in impedance. FIG. 6 shows better and more practical results, because the maximum value of $RH/R\infty$ is used as the sensitivity of the magnetic head.

Two reproduction systems have been described: reproduction utilizing changes in the tuning frequency with changes in the capacitance of the capacitance element 10 which are caused by changes in the magnetic permeability of the magnetic body 11, and reproduction utilizing changes in the Q of the tuned circuit caused by high-frequency loss of the magnetic body 11. Although either one of these systems may be selectively used, signal reproduction may also be performed utilizing both systems together by detecting the high-frequency signal output from the tuned circuit with the peak detector 20, since changes in the tuning frequency and in the Q occur simultaneously.

In the embodiment described above, changes in the magnetic permeability and changes in high-frequency loss in a weak or low magnetic field are utilized. However, changes in magnetic permeability and high-frequency loss due to the phenomenon of resonant absorption of microwaves in a strong or high magnetic field may also be utilized.

Figure 7:
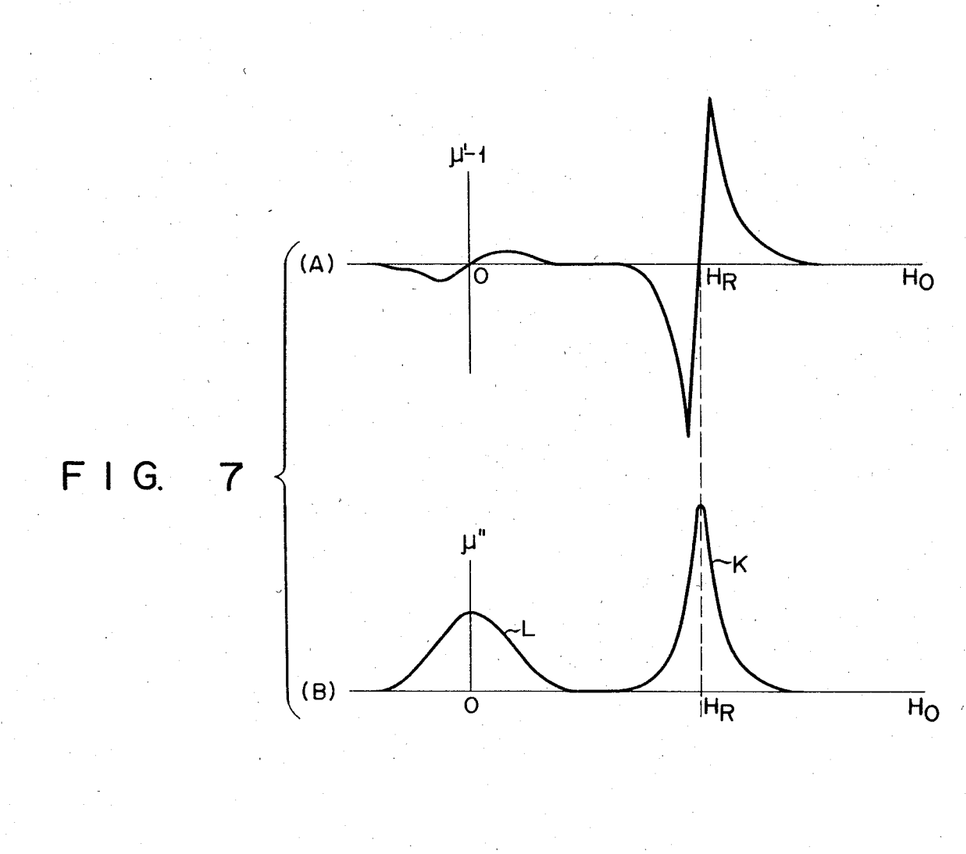
FIGS. 7A and 7B are graphs respectively showing the tensor permeability $\mu'$ and high-frequency loss $\mu''$ as functions of a magnetic field intensity.

FIGS. 7A and 7B show changes in the tensor permeability $\mu'$ and its loss term $\mu''$ in a given high-frequency magnetic field. The positive direction of the external magnetic field intensity is the direction along which resonance is caused when the direction of precession of a magnetization vector of a magnetic body and a frequency thereof coincide with the direction of circular polarization of high frequency components and a frequency thereof. As may be seen from these figures, a magnetic body generally has a characteristic curve L which indicates changes in magnetic permeability $\mu$ (tensor permeability $\mu'$) and the loss term $\mu''$ in a low magnetic field. The magnetic body also has a characteristic curve K which indicates changes in tensor permeability $\mu'$ and the loss term $\mu''$ in a high magnetic field in accordance with the phenomenon of resonant absorption of microwaves in a high magnetic field. Therefore, reproduction as described above may be performed utilizing this phenomenon with the configuration as shown in FIG. 1. In this case, a predetermined biasing magnetic field of a predetermined intensity must be applied to the magnetic body in a manner to be described below. A DC or AC magnetic field can be applied by a permanent magnet or an electromagnet as needed. In this case, if the frequency of the high-frequency magnetic field applied in the X-Y plane perpendicular to a resonant magnetic field HR is given as f, the frequency may be given by:

$$f=\gamma\sqrt{\{HR+(NX-NZ)MS\}\{HR+(NY-NZ)MS\}} \qquad (1)$$

where
  $\gamma$: gyromagnetic ratio which is generally 2.8 MHz/Oe

NX, NY and NZ: demagnetizing factors when the resonance magnetic field (external magnetic field) is applied along the Z-axis, wherein $NX+NY+NZ=4\pi$ MS: saturation magnetization When the external magnetic field is applied along the axis of the magnetic body of a plate-like shape, $NX=4\pi$ and $NY=NZ=0$. Therefore, equation (1) may be rewritten as:

$$f=\gamma\sqrt{HR(HR+4\pi MS)} \qquad (2)$$

This means that by suitably selecting the saturation magnetization value, the recording state can be readily maintained by holding the resonance magnetic field HR to be less than 300 to 500 oersteds, which is the coercive force of the magnetic tape. When f=280 MHz and a magnetic material having a saturation magnetization of 1,000 gausses or less, e.g., Al-substituted yttrium-iron garnet ferrite is used, the resonance magnetic field HR is 10 Oe. Therefore, if the biasing magnetic field is set to be 10 Oe, the tensor permeability and its loss term may be easily obtained. If the biasing magnetic field is set to be below 10 Oe and below the coercive force corresponding to the saturation magnetization (including the non-biased state), changes in low field loss may be easily obtained.

Figure 8A:
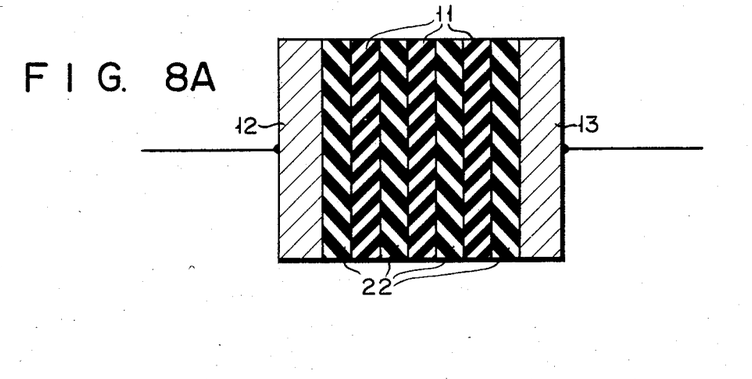
FIGS. 8A to 8C are sectional views showing capacitance elements according to other embodiments of the present invention.
Figure 8B:
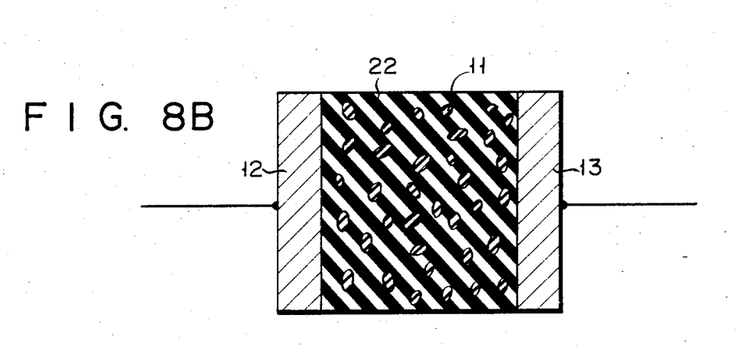

FIGS. 8A, 8B and 8C show other embodiments of the capacitance element 10. Referring to FIG. 8A, an interelectrode substance of a capacitance element 10 comprises a laminated body of magnetic bodies 11 and dielectric bodies 22. Each magnetic body 11 comprises ferrite, which is a typical high-frequency material and is nonconductive. Each dielectric body 22 comprises an inorganic compound such as $SiO_2$ or an organic dielectric material such as polystyrene, as needed. The thickness and number of the magnetic bodies and the dielectric bodies may be suitably selected. With the capacitance element 10 shown in FIG. 8A, the effective permittivity of the capacitance element 10 is increased, and the electric displacement intensity is increased. Accordingly, a high-frequency magnetic field corresponding to a differentiated value of the electric displacement intensity over time may be applied. In the embodiment shown in FIG. 8B, a magnetic body 11 is pulverized and the resultant powder is mixed with a dielectric body 22 to provide an interelectrode substance of a capacitance element 10. The capacitance element 10 shown in FIG. 8B provides similar effects to those of the capacitance element 10 shown in FIG. 8A.

Figure 8C:
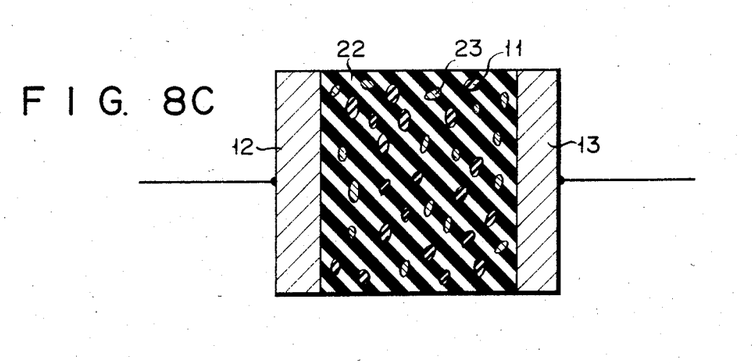

Referring to FIG. 8C, a metallic powder 23 is further added to a magnetic powder 11 which is to be mixed with a dielectric body 22 in order to further increase the effective permittivity of a capacitance element 10. In any of these embodiments shown in FIGS. 8A, 8B and 8C, a plurality of types of magnetic materials may be used for the magnetic body 11.

What we claim is:

1. A magnetic reproducer comprising:
    tuned circuit means having a capacitance element and an inductance element connected to said capacitance element in parallel, said capacitance element including a pair of electrodes and a magnetic body between said electrodes and serving as a magnetic head, the magnetic permeability of said magnetic body changing due to a change in the magnetic field formed by a magnetic recording medium;
    means for supplying a high-frequency input signal to said tuned circuit means; and
    detecting circuit means for detecting a change in a high-frequency output signal from said tuned circuit means so as to reproduce signals recorded on said magnetic recording medium, the change in the high-frequency output signal being dependent on a change in said magnetic permeability of said magnetic body which is caused by the change in the magnetic field of said magnetic recording medium.

2. A magnetic reproducer according to claim 1, wherein a laminated body comprising pluralities of said magnetic bodies and dielectric bodies which are arranged alternately is interposed between said electrodes of said capacitance element to be parallel to surfaces of said electrodes.

3. A magnetic reproducer according to claim 1, wherein a mixture of said magnetic body and a dielectric body is filled between said electrodes of said capacitance element.

4. A magnetic reproducer according to claim 1, wherein a mixture of said magnetic body, a dielectric body and a metallic body is filled between said electrodes of said capacitance element.

5. A magnetic reproducer according to claim 1, wherein surfaces of said electrodes of said capacitance element are arranged to be substantially perpendicular to said magnetic recording medium, and said magnetic recording medium moves along said capacitance element relative thereto.

6. A magnetic reproducer according to claim 1, wherein said detecting circuit means detects the change in the high-frequency output signal by utilizing a change in a tuning frequency of said tuned circuit means, the change in the tuning frequency being dependent on the change in the magnetic permeability of said magnetic body.

7. A magnetic reproducer according to claim 6, wherein the magnetic permeability of said magnetic body changes by ferromagnetic resonance.

8. A magnetic reproducer according to claim 1, wherein said detecting circuit means detects the change in the high-frequency output signal by utilizing a change in the quality Q of said tuned circuit means, the change in the quality Q being dependent on a change in the high-frequency loss of said magnetic body.

9. A magnetic reproducer according to claim 8, wherein the high-frequency loss of said magnetic body changes by ferromagnetic resonance.

10. A magnetic reproducer according to claim 1, wherein said detecting circuit means detects the change in the high-frequency output signal by utilizing changes in a tuning frequency and quality Q of said tuned circuit means, the changes in the tuning frequency and quality Q being dependent on the change in the magnetic permeability of said magnetic body.

11. A magnetic reproducer according to claim 10, wherein the magnetic permeability of said magnetic body changes by ferromagnetic resonance.

* * * * *